(12) United States Patent
Yuzwalk et al.

(10) Patent No.: US 6,188,227 B1
(45) Date of Patent: Feb. 13, 2001

(54) BIFILAR WOUND ISOLATION NETWORK

(75) Inventors: James J. Yuzwalk, Oxford; Walter R. Stringer, Oak Park, both of MI (US)

(73) Assignee: Chrysler Corporation, Auburn Hills, MI (US)

( * ) Notice: Under 35 U.S.C. 154(b), the term of this patent shall be extended for 0 days.

(21) Appl. No.: 09/193,176

(22) Filed: Nov. 16, 1998

(51) Int. Cl.[7] .................................................. G01R 27/28
(52) U.S. Cl. ............................................ 324/628; 324/627
(58) Field of Search .................................... 324/628, 627, 324/520, 521, 546, 548; 333/165, 166; 361/56, 58, 111

(56) References Cited

U.S. PATENT DOCUMENTS

| | | | |
|---|---|---|---|
| 4,763,062 | * | 8/1988 | Trzcinski .............................. 324/628 |
| 4,849,685 | * | 7/1989 | Nave ..................................... 324/613 |
| 5,414,345 | * | 5/1995 | Rogers ................................. 324/72.5 |
| 5,541,521 | * | 7/1996 | North et al. ......................... 324/628 |
| 5,617,284 | * | 4/1997 | Paradise ................................ 361/58 |

* cited by examiner

Primary Examiner—Safet Metijahic
Assistant Examiner—Anjan K Deb
(74) Attorney, Agent, or Firm—James R. Yee

(57) ABSTRACT

A test system having a bifilar wound isolation network disposed in between a device under test (DUT) and a device under test support system for providing a high isolation impedance to common mode signals present at the input terminals of the isolation network, while still providing a relatively lossless path for differential signals present across the input terminals of the isolation network. The isolation network comprises a plurality of four resonators each having a precise, predetermined number of turns and serially interconnected by a bifilar winding. The bifilar winding allows coupling to the inputs of a balanced DUT and enables a worst case operating environment to be provided for the balanced DUT to assist in testing and/or design of the DUT so as to minimize the effects on the DUT of electromagnetic interference and to assist in modifying the balanced DUT so as to immunize it from susceptible EMI receptors therewithin.

10 Claims, 1 Drawing Sheet

BIFILAR WOUND ISOLATION NETWORK

BACKGROUND OF THE INVENTION

1. Technical Field

This invention relates to electrical test systems, and more particularly to a test system incorporating an isolation network. The isolation network is adapted to be coupled between a device under test (DUT) and a DUT support system for generating an impedance which causes the DUT to emit its highest noise voltage levels during a test. This assists in developing worst case interference parameters which provide a guide for modifying the test item's components and connectors to minimize the effects of electromagnetic interference (EMI) generating sources and to immunize potential EMI receptors within the DUT.

2. Discussion

Various techniques have been employed to detect, measure and then suppress EMI in sensitive electrical equipment or test items. Interference or susceptibility detection and measuring should be conducted with the test item operating as close to service conditions as possible. Also, the test item normally is operated in its intended manner with anticipated inputs applied and its outputs normally loaded.

A problem exists with simulating service conditions in a normal manner of operation. To bring a test item out of its normal operating environment and to place it on a bench for a test, an actual duplication of operation of the test item seldom occurs. For example, if in a vehicle equipped with an engine control system that includes a microcomputer as a controller, assume it is desired to use a particular portable mobile two-way radio. Discovering that the radio works when the engine is shut off but doesn't work well while the engine is running, the engine control system is then removed from the vehicle and placed on a test bench for study. A simulator (support for the engine control system) is used to make the control system work as if it is in the vehicle. Also, assume the system responds as if it is operating in the vehicle controlling what it is supposed to be controlling. Assume also, the engine control system generates the same interference that it was putting out before it was placed on the bench, but now the interference reacts with the simulator. By virtue of changes in wiring, the coupling between harnesses, other components, and the impedance and length of wires, the engine control system generally radiates and conducts a different amount of interference.

Efforts have been made to standardize bench test setups in order to gain data that approaches actual circumstances. In prior bench tests under similar circumstances, line impedance stabilization networks (LISNs) have been recommended in a number of interference and susceptibility specifications for insertion in power leads to offer something approaching a standard impedance to the radio frequency (RF) current from test items. The LISN's, as required by some military specifications, introduce a standard 50 ohm power-source impedance for the test item so that conducted RF interference measurements can be compared to pass/fail limits without accounting for a source impedance variable. However, in several LISN designs a 5-microhenry coil is used so the device is suitable for use from 150 KHz to 25 MHz. Over this range, the source impedance varies from about 5 ohms at 150 KHz to 50 ohms at 25 MHz. It is not usable much above 25 MHz due to stray impedance. While it does furnish a standard impedance, it is not the impedance seen in the normal installation. It was never intended to be anything other than an A.C. power lines simulator.

Normally when trying to identify the potential of a device to be an interference source, it was thought that this determination depends upon how interference emanating from the source was measured. This implies that different test processes produced different results for the same interference source. Realizing the above conditions exist, efforts were made toward devising an interference measuring technique that didn't depend upon how the interference was measured. Systems which have been previously developed for this purpose are disclosed in U.S. Pat. Nos. 4,763,062 and 5,541,521, both assigned to the assignee of the present application, and hereby incorporated by reference into the present application. These test systems have performed in an exemplary fashion but nevertheless have been limited to devices under test which have one input referenced to ground.

With devices under test which do not have one signal line referenced to ground (i.e., balanced devices such as devices having differential inputs), previously developed EMI test systems have not been suitable for intercoupling between the device under test support equipment and the device under test itself. Accordingly, it is a principal object of the present invention to provide a test system forming an isolation network which is suitable to be intercoupled between a device under test and a device under test support system which is capable of providing a high isolation impedance to common mode signals present at input terminals of the isolation network, while still providing a relatively lossless path for differential signals present across the input terminals.

It is a further object of the present invention to provide an isolation network incorporating a bifilar winding which is relatively inexpensive to produce, which provides a broad bandwidth, and which enables balanced devices to be tested under worst case EMI operating conditions such that the device under test is forced to produce its highest noise voltage.

A test system as described above would therefore enable worst case interference parameters to be established and would also provide a repeatable scheme for determining worse case signals in any environment in which the device under test is employed. After establishing the worse case interference parameters, modification techniques and/or test item circuit components and connectors may be employed to minimize the effect of generating EMI sources and/or to immunize EMI susceptible receptors within the device under test.

SUMMARY OF THE INVENTION

The above and other objects are provided by a bifilar wound isolation network in accordance with a preferred embodiment of the present invention. The isolation network generally comprises a plurality of resonators which are serially interconnected by a single bifilar length of winding wound upon each one of a plurality of toroids. In a preferred embodiment of the present invention the isolation network comprises four independent inductors. The first inductor comprises approximately 45 turns (i.e., windings), the second inductor comprises about 30 turns, the third inductor comprises about 15 turns and the fourth inductor comprises about 10 turns. Each inductor is formed in part by a toroid which is supported upon a dielectric rod or dowel. The dielectric rod or dowel is in turn supported above a ground plane. An input end of the isolation network is coupled to an AC signal source and also to the device under test. An output end of the isolation network is coupled to a device under test support system. The bifilar winding allows the isolation network to be coupled to the differential inputs of the balanced device such that the device under test (DUT) essentially sees a high impedance to common mode signals, while the input terminals of the isolation network nevertheless provide a relative lossless path for the differential signals present across its inputs.

In the preferred embodiment of the present invention the first inductor has a resonant frequency of about 6.4 MHz, the second inductor a resonant frequency of about 15.4 MHz, the third inductor a resonant frequency of about 52.9 MHz and the fourth inductor a resonant frequency of about 87.5 MHz. The bifilar winding is comprised of two independent electrical conductors each being preferably a 26 gauge electrical conductor. The bifilar winding is wound upon each of the toroids such that the bifilar windings do not overlap one another (or have minimal overlap) when wound around each toroid, and further such that the bifilar winding extends from one inductor to the next in serial fashion.

In the preferred embodiment a capacitor is further independently coupled to each of the electrical conductors of the bifilar winding. Each capacitor couples its associated conductor to the ground plane. The test system further includes an RF signal source for injecting an RF signal into the input terminals of the isolation network.

The test system of the present invention provides a high isolation impedance to common mode signals present at the input terminals of the device under test while still providing a relatively lossless path for differential signals present across the input terminals.

BRIEF DESCRIPTION OF THE DRAWINGS

The various advantages of the present invention will become apparent to one skilled in the art by reading the following specification and subjoined claims and by referencing the following drawings in which:

DETAILED DESCRIPTION OF THE PREFERRED EMBODIMENTS

Figure 1:
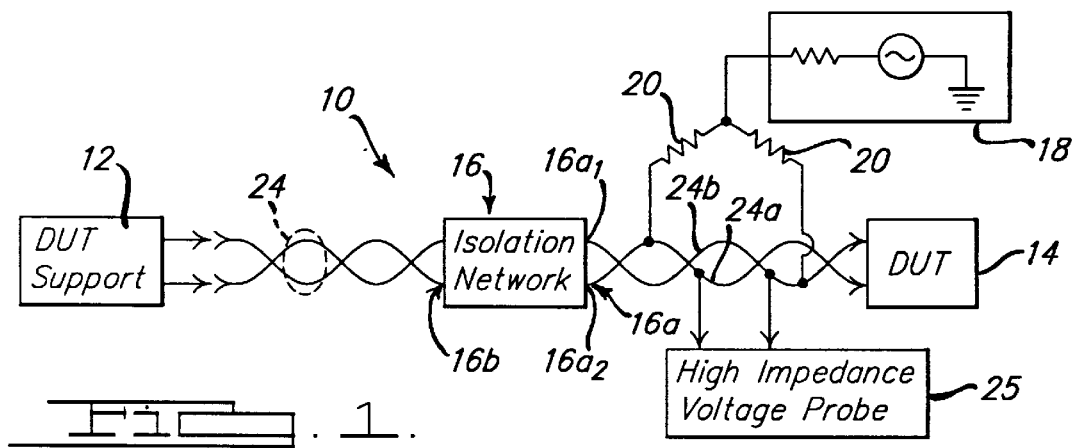
FIG. 1 is a simplified block diagram of the test system of the present invention.

Referring to FIG. 1 there is shown a test system 10 in accordance with the present invention. The test system 10 generally comprises a device under test (DUT) support system 12, a device under test (DUT) 14 and a bifilar wound isolation network 16 disposed in between the DUT support system 12 and the DUT 14. An RF signal source 18 is coupled via a pair of resistors 20 to supply an RF signal to the DUT 14 via a bifilar winding 24. Resistors 20 preferably each comprise 50 ohm resistors. The bifilar winding 24 is made up of two independent electrical conductors 24a and 24b. Each of the conductors 24a and 24b preferably comprise a 26 gauge electrical conductor, although it will be appreciated that a greater or lesser gauge conductor could be employed if desired.

The isolation network can be viewed as having an input side 16a and an output side 16b. The input side 16a provides a high isolation impedance to common mode signals present at input terminals $16a_1$ and $16a_2$ thereof, while still providing a relatively lossless path for differential signals present across the input terminals $16a_1$, $16a_2$. A high impedance measuring probe 25 is preferably coupled to the device under test 14 inputs as shown.

Figure 2:
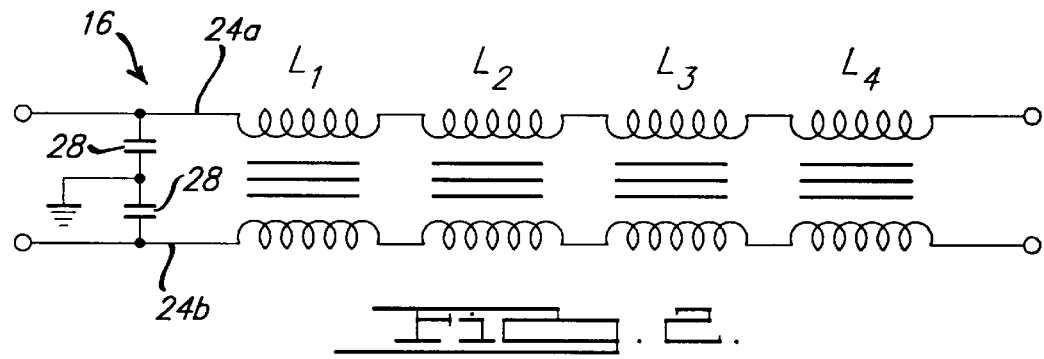
FIG. 2 is a simplified electrical schematic diagram of the isolation network of the present invention.

Referring now to FIG. 2, the isolation network 16 is shown in representative schematic form. The isolation network 16 generally comprises four resonators formed by inductors L1, L2, L3 and L4. The bifilar windings 24a and 24b are each coupled to ground through a capacitor 28. Capacitors 28 each comprise preferably about a 3300 pf capacitor. As can be seen, the bifilar winding 24 serially interconnects each of the inductors L1, L2, L3 and L4 to form a spaced apart series of inductances which each have a specific resonant frequency. Inductor L1 preferably comprises between about 40–50 turns of the bifilar winding 24, and most preferably about 45 turns. Inductor L1 has a frequency range between about 4.9 MHz–12.1 MHz and a resonant frequency of about 6.4 MHz. Inductor L2 preferably comprises between about 25–35 turns of the bifilar winding 24, and more preferably about 30 turns, and has a low frequency of about 10.9 MHz, a high frequency of about 36.2 MHz and a resonant frequency of about 15.4 MHz. Inductor L3 comprises between about 10–20 turns of the bifilar winding 24, and more preferably about 15 turns, and further comprises a low frequency of about 37.1 MHz, a high frequency of about 172.9 MHz and a resonant frequency of about 52.9 MHz. Inductor L4 has between about 5–15 turns of the bifilar winding 24, and more preferably about 10 turns, and has a low frequency of about 64.9 MHz, a high frequency of about 195.6 MHz and a resonant frequency of about 87.5 MHz. Inductor L1 has a Q of about 0.89, inductor L2 a Q of about 0.61, inductor L3 a Q of about 0.39 and inductor L4 a Q of about 0.67. It will be appreciated, however, that the number of turns on each inductor could vary, thereby varying the overall frequency response of each inductor, and the overall bandwidth of the isolation network 16.

To accomplish the number of turns needed to form each of the four inductors from a single length of bifilar winding 24, a twisted pair of conductors approximately six feet long is required. Sufficient length should be left for termination at the output side 16b of the isolation network 16 to enable the conductors 24a and 24b to be connected to the capacitors 28 and to the DUT Support System 12. Furthermore, inductor L2 should be spaced approximately 0.75 inches from inductor L1, inductor L3 spaced approximately 0.75 inches from inductor L2, and inductor L4 spaced approximately 0.75 inches from inductor L3. The windings on each inductor should preferably not overlap one another or the overlap should be minimal.

Figure 3:
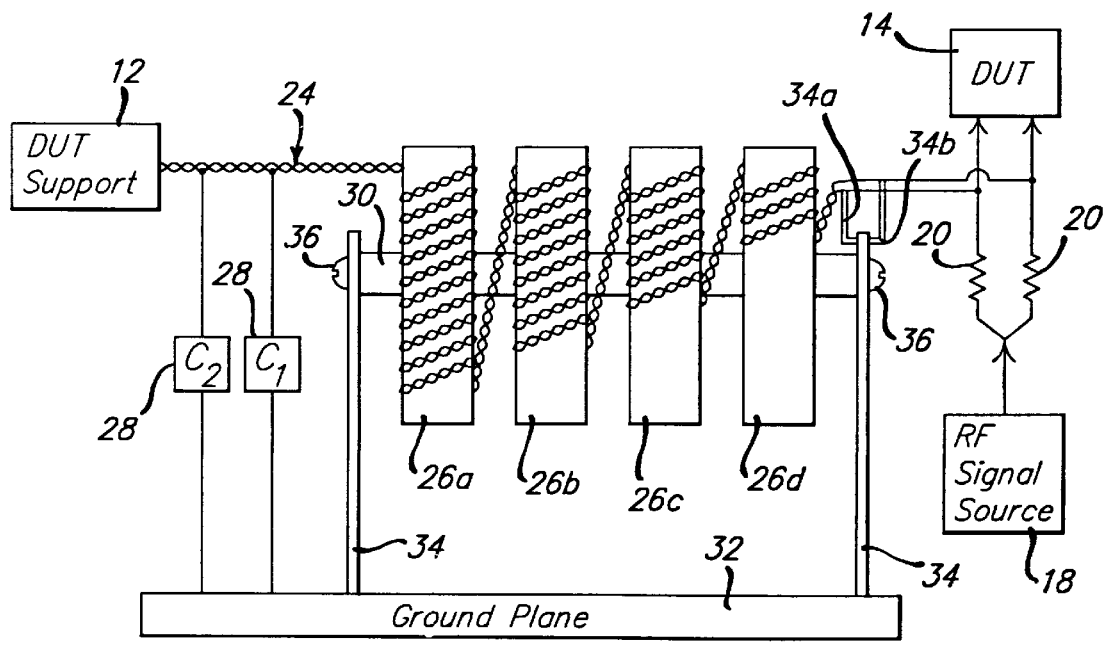
FIG. 3 is a simplified diagrammatic drawing of the present invention illustrating the bifilar winding serially interconnecting each of the inductors, and further with the inductors supported above a ground plane.

Referring now to FIG. 3, each inductor L1, L2, L3 and L4 comprises an iron core toroid 26 which can be obtained from Amidon Associates, Santa Ana, Calif. Toroid 26a is preferably about 0.690 inches in outer diameter and has an opening having an inner diameter of about 0.370 inches and a height of about 0.190 inches. Toroids 26b, 26c and 26d each have an outer diameter of preferably about 0.500 inches, an inner diameter of about 0.303 inches, and a height of about 0.190 inches. The toroids 26a–26d are longitudinally aligned such that a single dielectric dowel or rod 30 extends therethrough. The dielectric rod 30 is supported above a copper ground plane 32 by a pair of metallic brackets or supports 34 at each end of the dowel 30. Nylon or other non-conductive screws 36 extend through openings (not shown) in each of the supports 34 and into opposite ends of the dielectric rod 30 to allow the dielectric rod 30 to be fixedly secured to the supports 34. One of the supports 34 further includes a pair of metallic terminals 34a and 34b which are each coupled independently to associated ones of the electrical conductors 24a and 24b. It will also be noted that it is preferable that the turns on each of the inductors L1, L2, L3 and L4 be made along the uppermost half of each toroid 26a–26d as much as possible.

The dielectric rod 30 is preferably made from wood or plastic or any other material which is electrically non-conductive. The screws 36 may comprise any form of element suitable for fastening of the dielectric rod 30 to its associated supports 34, although the screws are preferably made from an electrically non-conductive material such as nylon. However, any non-conductive material having sufficient strength should suffice.

The test system 10 of the present invention provides a means for providing a high isolation impedance to common mode signals present at its input terminals $16a_1$ and $16a_2$ while still providing a relatively lossless path for differential signals present across these input terminals. The RF input impedance that the DUT 14 "sees" is essentially an open circuit impedance.

By using a distributed system of resonators (i.e., inductors L1, L2, L3 and L4), the isolation network 16 provides a high common mode rejection ratio over a much wider frequency range than would a single inductance. The result is a test system which can be used with balanced devices and which causes the DUT to generate its highest noise voltage levels to produce a worst case EMI output.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification and following claims.

We claim:

1. A conductive electromagnetic interference test system for determining electromagnetic interfering source components and receptor components within a device under test at worst case electromagnetic interference conditions, said system comprising:

a device under test support system for supplying power and signal support to said device under test;

a radio frequency signal generator coupled to said device under test for supplying a radio frequency signal to said device under test;

a measuring system coupled between said support system and said device under test, and being responsive to electromagnetic interference voltage signals transferred between said support system and said device under test;

an isolation system having an input and an output, said input being adapted to be coupled to said device under test and said output being adapted to be coupled to said support system, said isolation system operating to couple signals from said support system to said device under test while opposing the passage of selected electromagnetic interfering voltage signals from both said device under test and said support system and to provide a substantially worst case impedance load for said device under test while the latter is operating in response to said signals from said support system, the worst case impedance load causing interfering voltage signals from said device under test to confront substantially an open circuit impedance with respect to said input of said isolation system, thereby causing said device under test to produce a worst case interference voltage signal which can be measured by a measuring probe;

said isolation system including:
a plurality of serially connected resonators arranged between said input and said output thereof;
each of said resonators comprising a toroid supported along a dielectric rod;
a single length twisted pair of electrical conductors wound around each of said toroids to form a plurality of independent yet serially interconnected inductors each having a predetermined resonant frequency, such that said isolation system has a predetermined bandwidth;
said input of said isolation system having at least one capacitor coupled to at least one of said electrical conductors and to a ground plane;
said output of said isolation system having at least one resistor coupled to at least one of said electrical conductors and to said radio frequency signal generating systems;
said pair of electrical conductors allowing said isolation system to be coupled to said input of said device under test, and enabling the worst case impedance load to be provided for said device under test in order to minimize the affects of electromagnetic interference on said device under test; and
a first one of said inductors having a number of windings within a range of about 40–50, a second one of said inductors having a number of windings within a range of about 20–40, and a third one of said inductors having a number of windings within a range of about 10–20.

2. The test system of claim 1, wherein said plurality of inductors comprises a fourth inductor having about 5–15 windings.

3. The test system of claim 1, wherein said isolation system comprises an input end and an output end;
said input end comprising at least one capacitor coupled to at least one of said electrical conductors and to a ground plane; and
said output end comprising at least one resistor coupled to at least one of said electrical conductors and to said signal generating system.

4. The test system of claim 1, wherein said ground plane comprises a copper ground plane.

5. The test system of claim 1, wherein said first inductor has a resonant frequency of about 6.4 megahertz.

6. The test system of claim 1, wherein said second inductor has a resonant frequency of about 15.4 megahertz.

7. The test system of claim 1, wherein said third inductor has a resonant frequency of about 52.9 megahertz.

8. The test system of claim 2, wherein said fourth inductor has a resonant frequency of about 87.5 megahertz.

9. A conductive electromagnetic interference test system for determining electromagnetic interfering source components and receptor components within a device under test at worst case electromagnetic interference conditions, said system comprising:

a signal support system for supplying power and signal support to said device under test;

a radio frequency signal generator for generating radio frequency signals applied to an input of said device under test;

a measuring system coupled between said signal support system and said device under test, and being responsive to electromagnetic interference voltage signals transferred between said signal support system and said device under test;

an isolation system having an input and an output, said input being adapted to be coupled to said device under test and said output being adapted to be coupled to said signal support system, said isolation system operating to couple signals from said signal support system to said device under test while opposing the passage of selected electromagnetic interfering voltage signals from both said device under test and said signal support system and to provide a substantially worst case impedance load for said device under test while the latter is operating in response to said signals from said signal support system, the worst case impedance load causing interfering voltage signals from said device under test to confront substantially an open circuit impedance with respect to said input of said isolation system, thereby causing said device under test to produce a worst case interference voltage signal which can be measured by said measuring system to provide a reference upon which a repeatable measure of an interference voltage signal can be determined when interference suppression techniques are supplied to rid or reduce electromagnetic interfering source and receptor components of said device under test;

said isolation system including:
- a plurality of serially connected resonators arranged between said input and said output of said decoupling system;
- each of said resonators comprising a toroid supported along a dielectric rod;
- a single length twisted pair of electrical conductors wound around each of said toroids to form a plurality of independent yet serially interconnected inductors each having a predetermined resonant frequency, such that said isolation system has a predetermined bandwidth;
- said pair of electrical conductors allowing said isolation system to be coupled to said input of said device under test, and enabling the worst case impedance load to be provided for said device under test in order to minimize the effects of electromagnetic interference on said device under test;
- a pair of capacitors independently coupled to each of said electrical conductors and to a ground plane;
- a pair of resistors independently coupled to each of said electrical conductors and to said radio frequency signal generator;
- a first one of said inductors having a number of windings within a range of about 40–50, a second one of said inductors having a number of windings within a range of about 20–40, a third one of said inductors having a number of windings within a range of about 10–20, and a fourth one of said inductors having a number of windings within a range of about 5–15; and
- wherein said first inductor has a resonant frequency of about 6.4 megahertz, said second inductor has a resonant frequency of about 15.4 megahertz, and said third inductor has a resonant frequency of about 52.9 megahertz, and said fourth inductor has a resonant frequency of about 87.5 megahertz.

10. The test system of claim 9, wherein said electrical conductors are wound over each of said toroids so as not to overlap one another on said toroids.

\* \* \* \* \*